United States Patent [19]

Kendrick et al.

[11] 4,352,066
[45] Sep. 28, 1982

[54] METHOD FOR ADJUSTING THE MAGIC ANGLE IN NMR EXPERIMENTS

[75] Inventors: Raymond D. Kendrick, San Jose, Calif.; Robert A. Wind, Zoetermeer, Netherlands; Costantino S. Yannoni, Los Gatos, Calif.

[73] Assignee: International Business Machines Corporation, Armonk, N.Y.

[21] Appl. No.: 202,546

[22] Filed: Oct. 31, 1980

[51] Int. Cl.³ .......................................... G01N 27/00
[52] U.S. Cl. .................................... 324/321; 324/311
[58] Field of Search ........................ 324/300, 311, 321

[56] References Cited

U.S. PATENT DOCUMENTS 4,201,941 5/1980 Fyfe ..................................... 324/321
4,254,373 3/1981 Lippmaa et al. .................... 324/321
4,275,350 6/1981 Hill et al. ............................. 324/321

OTHER PUBLICATIONS

J. Schaefer and E. O. Stejskal, JACS 98 (1976), pp. 1031.

Primary Examiner—Michael J. Tokar
Attorney, Agent, or Firm—Joseph E. Kieninger

[57] ABSTRACT

A method for adjusting the orientation of the rotation axis for a sample in a nuclear magnetic resonance (NMR) experiment includes using a field gradient in a specific direction with respect to the external magnetic field of the NMR experiment to establish a calibrated reference direction with which the rotation axis may be aligned. Preferably, the magnetic field gradient is at an angle of 54.7°. A preferred embodiment of this invention includes automatic control steps in the method.

5 Claims, 5 Drawing Figures

METHOD FOR ADJUSTING THE MAGIC ANGLE IN NMR EXPERIMENTS

DESCRIPTION

1. Technical Field

This invention relates to NMR experiments, and more particularly, to a method of orienting the sample spinning axis to an angle of 54.7°, i.e. the magic angle.

It is a primary object of this invention to provide an improved method for NMR experiments.

It is another object of this invention to provide a method for adjusting the "magic angle" in NMR experiments.

It is still another object of this invention to provide a method for magic angle adjustment in NMR experiments that is fast.

It is yet still another object of this invention to provide a magic angle adjustment method that yields high quality data which is sensitive to axis alignment.

2. Background Art

A NMR technique has been developed to measure high resolution $^{13}C$ spectra in solids, (J. Schaefer and E. O. Stejskal, J.A.C.S. 98 (1976), page 1031). This technique, called Cross Polarization Magic Angle Spinning (CPMAS), uses a combined r.f. irradiation on the rare spins ($^{13}C$) and the abundant spins (usually $^1H$ or $^{19}F$) of a sample rotating around an axis making the so-called magic angle of 54°, 44' with the external $H_o$ field. In this way, the polarization of the $^{13}C$ is first enhanced and then observed while decoupling the abundant spins. The spinning of the sample eliminates the chemical shift anisotropies of the $^{13}C$ lines, which otherwise would broaden these lines considerably.

Usually the resolution of the $^{13}C$ spectra depends rather critically on setting the sample rotation axis at the magic angle. In fact, for each sample a readjustment is necessary. In case of weak signals, where it can take half a day or more to obtain a spectrum with a reasonable signal-to-noise ratio, it is extremely time-consuming to perform this readjustment.

A possibility of overcoming this difficulty is to look at the $^{13}C$ NMR of the rotor (sample holder) material instead of that of the material which it contains. If the abundant spins of the sample are protons, usually the rotor material contains hydrocarbons containing fluorine only (Kel-F[b] or Teflon[a]), whereas the rotors are made of proton-containing material like Delrin[a] in case the samples contain $^{19}F$. In both cases it is possible to obtain a $^{13}C$ spectrum of the rotor material in an acceptable time, so that adjustment of the magic angle can be performed. However, the spectra of all the rotor materials mentioned above do not depend very critically on the magic angle condition, and for many samples a more accurate adjustment is necessary. For example, the magnitude and linewidth of the $^{13}C$ Delrin line leads to an uncertainty in the rotational angle of at least ±3°, whereas in many samples an accuracy is demanded of ±0.5° or less.

(a) Trademark of duPont;
(b) Trademark of Minnesota Mining and Manufacturing.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be had to the following description and accompanying drawings common to the appendent claims in which the various novel features of the invention are more particularly set forth.

A method for adjusting the orientation of the rotation axis for a sample in a nuclear magnetic resonance (NMR) experiment includes using a field gradient in a specific direction with respect to the external magnetic field of the NMR experiment to establish a calibrated reference direction with which the rotation axis may be aligned. Preferably, the magnetic field gradient is at an angle of 54.7°. A preferred embodiment of this invention includes automatic control steps in the method.

BEST MODE FOR CARRYING OUT THE INVENTION

Figure 1A:
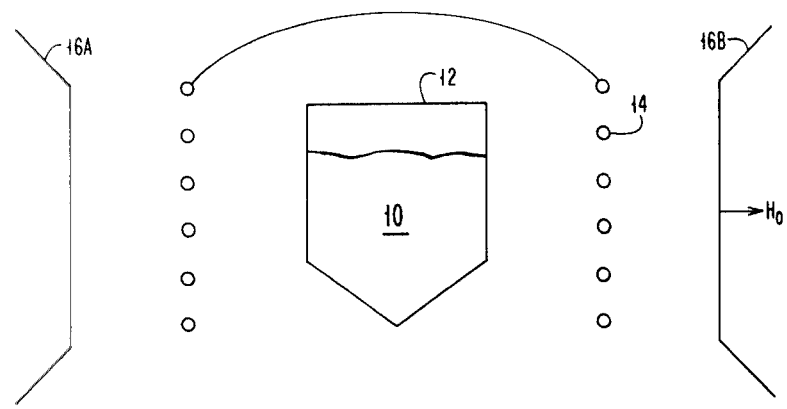
FIGS. 1A–E illustrate a schematic view of the steps of this method in accordance with this invention.

As shown in FIG. 1A, a solid powdered sample 10 is placed in the sample holder 12 which is positioned in an rf coil 14 and the external magnetic field formed by magnet poles 16A and 16B of the NMR spectrometer (not shown). It is possible to use a solid block of material to serve as the sample and not use a sample holder 12. The strength of the magnetic field is $H_o$ gauss in the direction shown. The sample holder 12 at this point is positioned vertical, that is substantially perpendicular to the direction of the magnetic field direction as indicated by the arrow.

Figure 1B:
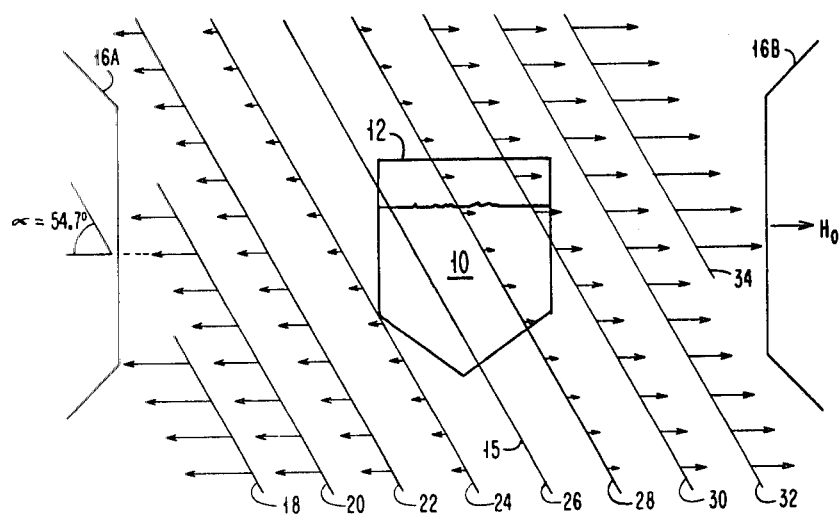

A magnetic field gradient is superimposed across the sample and this results in a DC field that has different values over different parts of the sample, as shown in FIG. 1B. FIG. 1B shows a specific field gradient in the sample area. The length of the arrows in the figure indicates the strength of the magnetic field added to or subtracted from the external DC magnetic field, $H_o$. The planes of equal field strength 18, 20, 22, 24, 26, 28, 30, 32 and 34 make a common angle with respect to the direction of the static external magnetic field. In a preferred embodiment, that angle, $\alpha$, equals 54.7°, the angle commonly referred to in NMR experiments as the magic angle. The field gradient is kept on during the entire procedure.

Figure 1C:
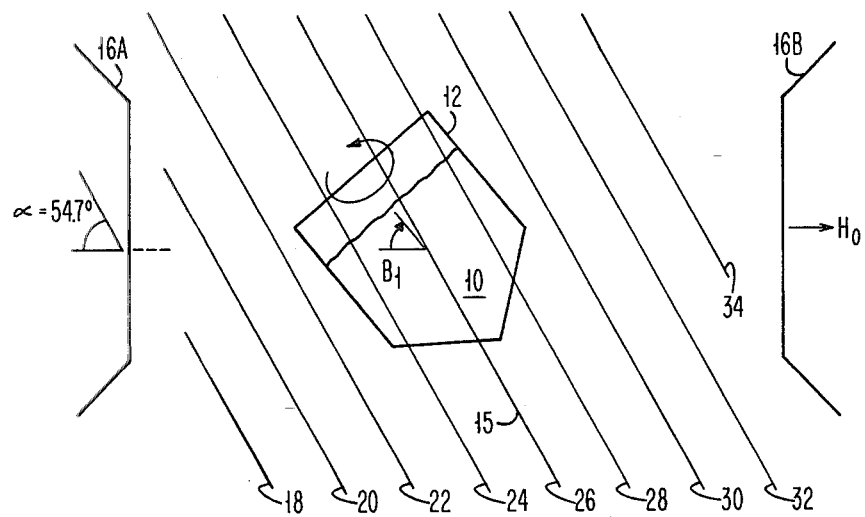

The next step is shown in FIG. 1C, in which the sample is rotated about an axis 35 which makes a second particular angle, $\beta$, with respect to the magnetic field $H_o$. The angle $\beta_1$ in FIG. 1C is less than the angle $\alpha$.

The next step involves observing the width of the NMR resonance lines obtained while rotating the sample around an axis at the angle $\beta$. As shown in FIG. 1C, the angle $\beta$ is significantly smaller than the angle $\alpha$, and, as a result, the width of the NMR resonance lines obtained are relatively large.

Figure 1D:
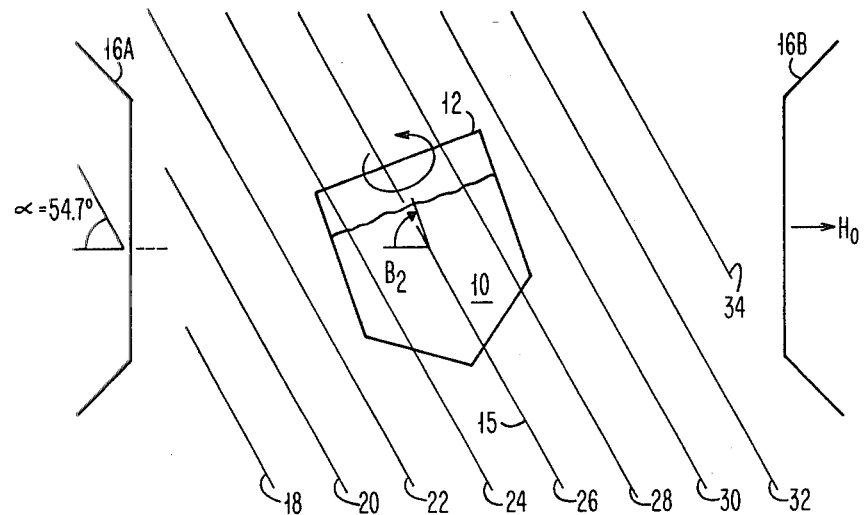

The next step as shown in FIG. 1D, is to change the position of the sample holder 12 so that the angle $\beta$ changes. In this case, the angle $\beta_2$ is larger than the angle $\alpha$ and the width of the NMR resonance lines obtained with this $\beta_2$ is also relatively large.

Figure 1E:
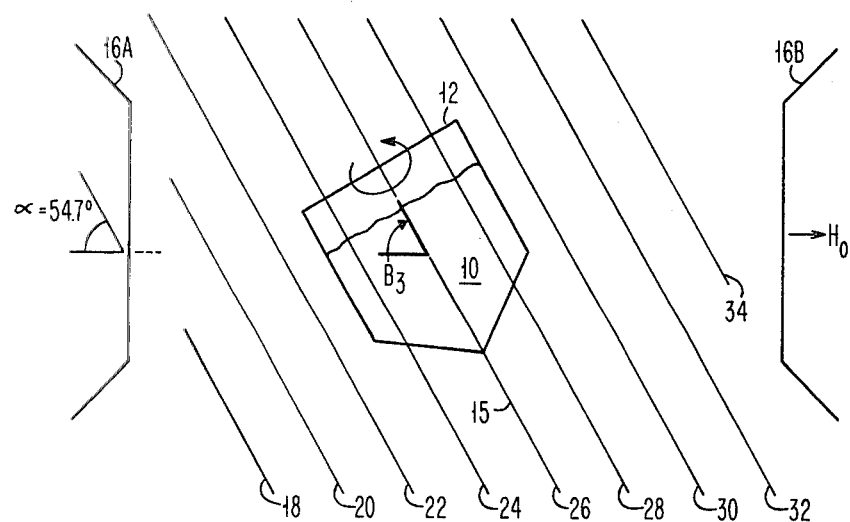

The direction of the rotation axis of the sample holder 12 is changed until the width of the NMR resonance lines is at a minimum. At this point the angle $\beta_3$ is equal to the angle $\alpha$, as shown in FIG. 1E. In this case the rotation axis of the sample holder 12 and the magic angle axis are coincident. As long as the angles $\beta$ and $\alpha$ are unequal, there is a broad line width. The line width only becomes a minimum when the rotational axis and the magic angle axis become coincident. The line width increases as the difference between the angles $\beta$ and $\alpha$ increase.

The method described above permits obtaining the proper alignment of the two axes which provides the system with a good signal-to-noise ratio in about 30 seconds. Accuracies of the order of 0.2° in magic angle adjustment can be obtained.

The direction of the magnetic field gradient with respect to the external magnetic field $H_o$ is initially established at an angle of 54.7° by obtaining the NMR spectrum of spinning solid sample. The NMR resonance lines of the sample chosen must have a width (amplitude) which is very sensitive to the direction which the spinning axis makes with respect to the external magnetic field $H_o$. The direction of the rotating axis of this sample is changed until the width of these lines is a minimum. This means that the sample is spinning about an axis which makes an angle of 54.7° with respect to the external magnetic field. A field gradient is then applied across the sample as in FIG. 1B. The planes of equal field strength make some angle $\beta$ with respect to the external magnetic field. The width of the NMR resonance lines will then increase if the angle $\beta$ is not equal to 54.7°. The currents in the coils used to generate the gradient are changed so that the direction of the gradient is changed until the width of the NMR resonance lines of the spinning angle is a minimum. The gradient is then oriented along a direction which makes an angle of 54.7° with respect to the external magnetic field. This procedure for establishing the direction of the field gradient need only be performed one time.

This method can be automated by the addition of the following steps. The first step would be to modulate the current through the coils used to generate the static magnetic field gradient so that the direction of the magnetic reference axis is modulated. The next step would be to synchronously detect the NMR signal amplitude changes caused by the gradient modulation. The last step would be to provide an error signal based on the amplitude and the phase changes of the NMR signal to a device which automatically adjusts the direction of the second angle of the rotation axis until the error signal is zero. At this point, the angles $\alpha$ and $\beta$ would be equal as in FIG. 1E. These steps could be affected with conventional equipment as is well known in the art.

INDUSTRIAL APPLICABILITY

This method is useful in NMR cross-polarization magic angle spinning techniques in which the sample has to be rotated about an axis making the so-called magic angle of 54.7° with the external magnetic field. This method can also be automated so that the samples are rotated about an axis at the specific angle required.

While I have illustrated and described the preferred embodiments of my invention, it is understood that I do not limit myself to the precise construction herein disclosed, and the right is reserved to all changes and modifications coming within the scope of the invention, as described in the attendant claims.

We claim:

1. A method of orienting the rotation axis of a spinning sample used in a nuclear magnetic resonance (NMR) experiment comprising the steps of:
    (a) placing the sample within the r.f. excitation coil and the static external magnetic field of an NMR spectrometer,
    (b) superimposing a static magnetic field gradient at an angle of about 54.7° with respect to the direction of the static external magnetic field $H_o$ thereby providing a magnetic field reference axis,
    (c) rotating the sample about an axis which makes a second particular angle with respect to the magnetic field reference axis,
    (d) observing the width of the NMR resonance lines obtained while rotating the sample, and
    (e) changing the second particular angle with respect to the magnetic field reference axis until the width of the NMR resonance lines obtained from rotating the sample is a minimum.

2. A method is described in claim 1, including the step of observing the height of the NMR resonance lines obtained while rotating the sample until a maximum height is obtained.

3. A method as described in claim 1, whereby the field gradient is established at an angle of 54.7° by using steps which include a material with an NMR spectrum which is sensitive to the orientation of the gradient.

4. A method described in claim 1 including the steps of:
    (a) modulating the currents through the coils used to generate the static magnetic field gradient so that the direction of the magnetic field reference axis is modulated,
    (b) synchronously detecting the NMR signal amplitude changes caused by the gradient modulation, and
    (c) providing an error signal based on the amplitude and phase changes of the NMR signal to a device which automatically adjusts the direction of the second angle of the rotation axis until the error signal is zero.

5. A method of orienting the rotation axis of a spinning sample used in a nuclear magnetic resonance experiment comprising the steps of:
    (a) placing the sample within the r.f. excitation coil and the static external magnetic field of an NMR spectrometer,
    (b) superimposing a static magnetic field gradient at an angle of about 54.7° with respect to the direction of the static external magnetic field thereby providing a magnetic field reference axis,
    (c) rotating the sample about an axis which makes a second particular angle with respect to the magnetic field reference axis,
    (d) observing the height of the NMR resonance lines obtained while rotating the sample, and
    (e) changing the second particular angle with respect to the magnetic field reference axis until the height of the NMR resonance lines obtained from rotating the sample is a maximum.

* * * * *